(12) United States Patent
Shen et al.

(10) Patent No.: US 12,027,497 B2
(45) Date of Patent: Jul. 2, 2024

(54) SEMICONDUCTOR DEVICE WITH UNBALANCED DIE STACKUP

(71) Applicant: Western Digital Technologies, Inc., San Jose, CA (US)

(72) Inventors: Haiyue Shen, Shanghai (CN); Fen Yu, Shanghai (CN); Hope Chiu, Shanghai (CN); Donghua Wu, Shanghai (CN); Hua Tan, Shanghai (CN); Xinyu Wang, Shanghai (CN); Shenghua Huang, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 297 days.

(21) Appl. No.: 17/649,614

(22) Filed: Feb. 1, 2022

(65) Prior Publication Data
US 2023/0246000 A1    Aug. 3, 2023

(51) Int. Cl.
*H01L 25/065* (2023.01)
*H01L 23/00* (2006.01)

(52) U.S. Cl.
CPC ......... *H01L 25/0657* (2013.01); *H01L 24/48* (2013.01); *H01L 2224/48147* (2013.01); *H01L 2224/48225* (2013.01); *H01L 2225/06562* (2013.01); *H01L 2924/1438* (2013.01)

(58) Field of Classification Search
CPC ............... H01L 25/0657; H01L 24/48; H01L 2224/48147; H01L 2224/48225; H01L 2225/06562; H01L 2924/1438; H10B 80/00
See application file for complete search history.

(56) References Cited

U.S. PATENT DOCUMENTS

| | | | |
|---|---|---|---|
| 6,627,477 B1 | 9/2003 | Hakey et al. | |
| 2017/0125378 A1* | 5/2017 | Park | H01L 24/48 |
| 2018/0254261 A1* | 9/2018 | Park | H01L 25/0652 |

* cited by examiner

*Primary Examiner* — Timor Karimy
(74) *Attorney, Agent, or Firm* — Morgan, Lewis & Bockius LLP

(57) ABSTRACT

A semiconductor memory package includes a substrate, a first stack of memory dies, and a second stack of memory dies. The first stack of memory dies includes a first substack of staggered memory dies offset with respect to each other in a first direction and a second substack of staggered memory dies offset with respect to each other in the first direction and positioned above the first substack. The second stack of memory dies includes a third substack of staggered memory dies offset with respect to each other in a second direction and a fourth substack of staggered memory dies offset with respect to each other in the second direction and positioned above the third substack. The top memory die of the first substack and a memory die positioned below the top memory die of the third substack are at least partially coplanar.

20 Claims, 5 Drawing Sheets

SEMICONDUCTOR DEVICE WITH UNBALANCED DIE STACKUP

BACKGROUND

A semiconductor memory package may include a plurality of semiconductor memory dies and a controller packaged together on a substrate and encapsulated in a molding compound. The memory dies may be disposed in adjacent stacks, with the memory dies in each stack being electrically coupled to the substrate with respective pluralities of bonding wires. The substrate includes communication lines that route electrical signals between the bonding wires and the controller and to external connections.

As semiconductor memory packages continue to increase in storage capacity and decrease in size, the spacing between adjacent stacks of memory dies decreases, which makes it difficult for the molding compound to fill in the interior package space during encapsulation. Moving the adjacent stacks of memory dies farther apart to accommodate the flow of molding compound would have the undesired effect of increasing the package size. Thus, there may be a tradeoff between encapsulation quality and package size.

SUMMARY

The present disclosure describes a semiconductor memory package having memory die stacks arranged in a configuration that accommodates the flow of molding compound between the stacks without increasing the size of the package.

In one aspect, a semiconductor memory package includes a substrate including a top surface extending in a first direction and a second direction opposite the first direction, a first stack of memory dies, and a second stack of memory dies adjacent to the first stack of memory dies. The first stack of memory dies is electrically coupled to the top surface of the substrate and includes a first substack of staggered memory dies and a second substack of staggered memory dies. The memory dies in the first substack are offset with respect to each other in the first direction and include a bottom memory die and a top memory die. The memory dies in the second substack are offset with respect to each other in the first direction and positioned above the first substack of staggered memory dies. The second stack of memory dies is electrically coupled to the top surface of the substrate and includes a third substack of staggered memory dies and a fourth substack of staggered memory dies. The memory dies in the third substack are offset with respect to each other in the second direction and include a bottom memory die and a top memory die. The memory dies in the fourth substack are offset with respect to each other in the second direction and positioned above the third substack of staggered memory dies. The top memory die of the first substack and a memory die positioned below the top memory die of the third substack are at least partially coplanar.

Thus, a gap between the top memory die of the first substack and the top memory die of the third substack is large enough for sufficient flow of molding compound during encapsulation without requiring an increase in package size.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
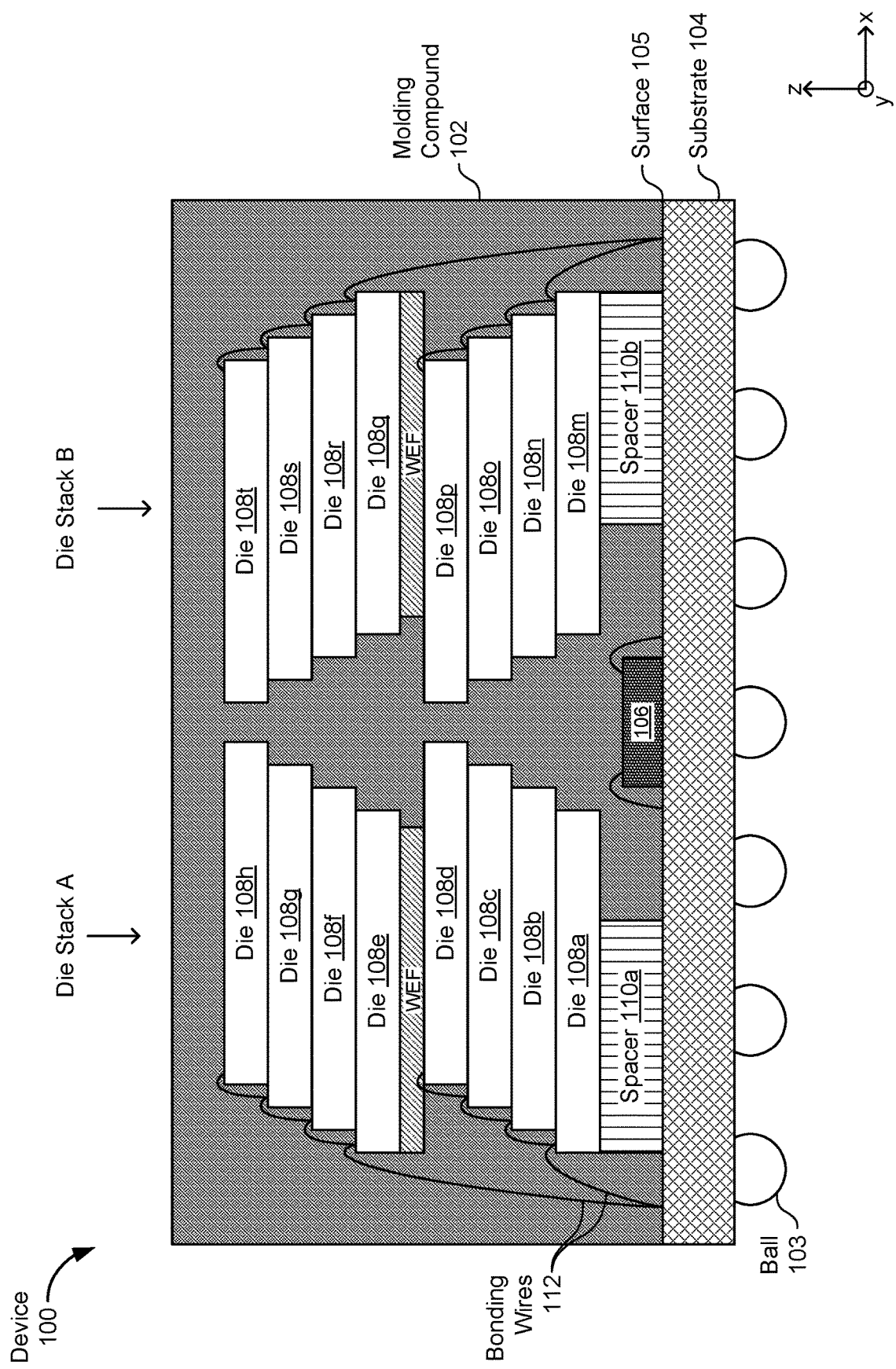
FIG. 1 is a cross-sectional side view of a portion of a semiconductor memory package including a substrate, a controller, and two stacks of memory dies.

FIG. 1 is a cross-sectional side view of a portion of a semiconductor memory device 100 including a substrate 104 having an upper surface 105, a controller 106, and two stacks A and B of semiconductor memory dies 108, all encapsulated in a molding compound 102. Molding compound 102 may include, for example, an epoxy molding compound (EMC) or other encapsulant material known in the art. As used herein, the term "encapsulation" refers to the process of sealing a semiconductor device with molding compound, thereby protecting internal components (e.g., processors, memory dies, and bonding wires) from breakage.

Device 100 may be any type of semiconductor device, such as a system-in-package (SiP). In one nonlimiting example, device 100 is a storage device (e.g., a secure digital (SD) card or a MultiMediaCard (MMC)) and the memory dies 108 are Not AND (NAND) memory dies.

Substrate 104 is both a mechanical base support of device 100 and an electrical interface that provides access to the memory dies 108 housed within the package. The electrical interface includes a plurality of metal layers within the substrate, including at least one layer for routing data using conductive (e.g., copper) traces, a ground layer, and/or a power layer. The plurality of metal layers include at least (i) a top layer in electrical contact with controller 106 and bonding wires 112 and upon which controller 106 and other elements may be mounted, and (ii) a bottom layer in electrical contact with solder balls 103, through which signals are routed between memory dies 108 and circuit elements outside device 100.

Controller 106 may be an application-specific integrated circuit (ASIC), or any other type of controller. In some implementations, controller 106 may be electrically coupled to the top layer of substrate 104 using bonding wires. In other implementations, controller 106 may be mounted using flip chip mounting.

Spacers 110a and 110b allow die stacks A and B to be mounted closer to the center of device 100, thus allowing for reduced x-y dimensions of the package.

Memory dies 108 (sometimes referred to as semiconductor dies) may be integrated circuits configured for data storage. In some implementations, memory dies 108 are NAND flash memory dies, each comprising a plurality of NAND memory cells. In other implementations, memory dies 108 may each comprise a plurality of other types of memory cells, such as Not OR (NOR) memory cells. While not shown in the figure, a die attach film (DAF) may be positioned above and/or underneath each memory die 108 in order to connect the memory dies to each other (and to the spacers, wire-embedded films, substrate, and so forth) in the packaging process.

The use of two die stacks in a side-by-side configuration (one on each side of the controller 106) allows more memory dies 108 to be electrically coupled to the controller 106 than if there was a single die stack, without expanding the package size in the x-y directions and/or the z direction. Such a configuration optimizes routing between the bonding wires 112 and channels on both sides of the controller 106. For example, bonding wires 112 coupled to memory dies in stack A may be coupled to communication lines in substrate 104 that are routed to one or more bonding pads on one side of controller 106, and bonding wires 112 coupled to memory dies in stack B may be coupled to communication lines in substrate 104 that are routed to one or more bonding pads on the other side of controller 106. Here the term "channel" refers to an external connection to the controller, such as a memory die bonding pad, and the term "communication line" refers to metal traces within the substrate that are used to route signals between the memory dies 108 and the controller 106 and external devices (not shown).

Further, the use of two die stacks in a side-by-side configuration allows the memory dies 108 to be thicker (in the z direction) compared to the same amount of memory dies in a single stack configuration in a device having the same package size. Thicker memory dies may have a simpler structure compared to thinner memory dies having similar capacity.

Each die stack in device 100 includes two substacks of staggered (offset in the x direction) memory dies. Specifically, die stack A includes one substack having four staggered memory dies 108a-d and another substack having four staggered memory dies 108e-h. Die stack B includes one substack having four staggered memory dies 108m-p and another substack having four staggered memory dies 108q-t. Each substack within a single die stack is stacked such that the bottom memory dies of each substack (e.g., 108a and 108e) substantially align in the x direction, and the top memory dies of each substack (e.g., 108d and 108h) substantially align in the x direction. In this disclosure, substantial alignment between two particular memory dies in the x direction means the two particular memory dies (e.g., 108a and 108e) are more aligned in the x direction than either of the two particular memory dies and its immediate neighbor (e.g., 108a and 108b).

Each die stack in device 100 includes a wire-embedded film (WEF) layer positioned between the two substacks. Specifically, there is a WEF between memory dies 108d and 108e, and there is a WEF between memory dies 108p and 108q.

In some implementations, device 100 may include more than two stacks of memory dies, greater than or less than eight memory dies in each stack, greater than or less than four memory dies in each substack, or different numbers of memory dies in each stack or substack. By adding more memory dies to the device, the storage capacity of device 100 is increased. However, this increased storage capacity comes at a cost of added complexity, including higher stack height, longer bonding wires, and more complicated internal routing. With this added complexity, longer bonding wires are more susceptible to wire sweep during encapsulation.

Figure 2:
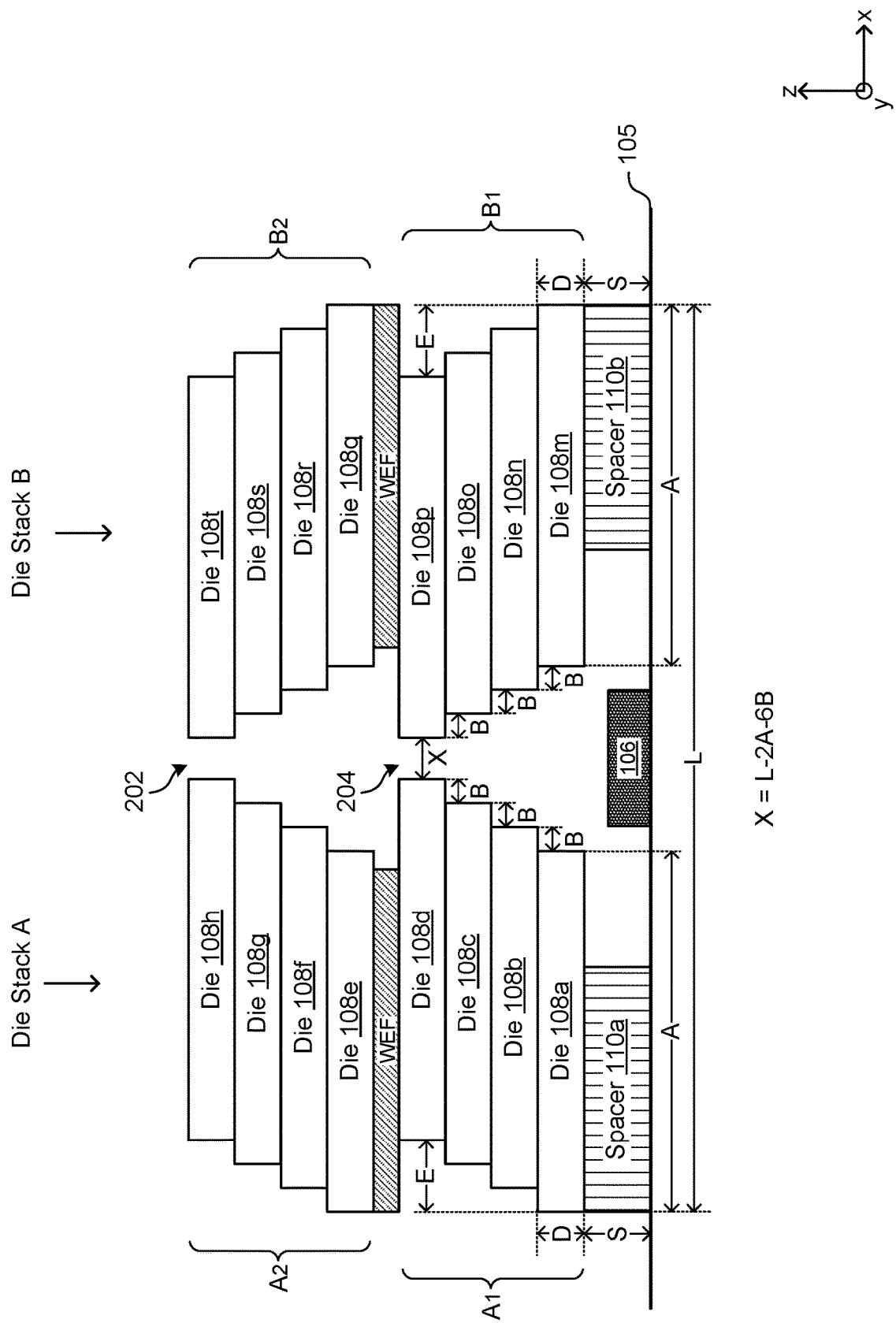
FIG. 2 is a detailed view of the two stacks of memory dies depicted in FIG. 1.

The die stacks in device 100 are staggered in opposite directions in a mirrored configuration. Specifically, memory dies 108a-h in die stack A are staggered in the +x direction from bottom to top (in the +z direction), and memory dies 108m-t in die stack B are staggered in the −x direction from bottom to top (in the +z direction). Such a configuration may be optimal for internal routing of data and signals between the memory dies 108 and controller 106. However, with a such a configuration, narrow gaps between neighboring pairs of top memory dies in each substack (e.g., between 108h and 108t, and between 108d and 108p) may inhibit the flow of molding compound 102 during encapsulation (see, e.g., FIG. 5). As such, these gaps may be subject to a minimum offset requirement in order to ensure sufficient encapsulation quality (e.g., no voids in the molding compound 102). FIG. 2 describes the minimum offset requirements in more detail, and FIGS. 3 and 4 describe implementations for meeting the minimum offset requirements.

FIG. 2 is a detailed view of the two stacks of memory dies of device 100 depicted in FIG. 1. Die stack A includes a first substack A1 of memory dies 108a-108d and a second substack A2 of memory dies 108e-108h. Die stack B includes a first substack B1 of memory dies 108m-108p and a second substack of memory dies 108q-108t. Throughout this application, substacks A1, A2, B1, and B2 may be respectively referred to as first, second, third, and fourth substacks in order to clarify which substacks are being referred to.

Memory dies 108 have a thickness D, and spacers 110 have a thickness S. Throughout this disclosure, "thickness" refers to dimensions in the z direction, and "z direction" may be substituted with "+z direction" or "−z direction," both of which are perpendicular to top surface 105 of the substrate.

Memory dies 108 have a length A and are offset with respect to each other by an offset distance B. Specifically, memory dies 108a and 108b are offset with respect to each other by offset distance B, memory dies 108b and 108c are offset with respect to each other by offset distance B, and so forth. The offset distances in die stack A add up to E, and the offset distances in stack B add up to E. Throughout this disclosure, "length" and "offset distance" refer to dimensions and distances in the x direction, "length" may alternatively be referred to as "width," and "x direction" may be substituted with "+x direction" (a first direction) or "−x direction" (a second direction opposite of the first direction), both of which are parallel to top surface 105 of the substrate.

The memory dies 108 in each die stack that are closest to each other in the x direction have a gap X between them.

Stated another way, die stacks A and B have a gap X between them. Throughout this disclosure, "gap" refers to distances in the x direction.

Die stacks A and B occupy a footprint on the top surface 105 of the substrate having a length L in the x direction. Length L of the footprint is equal to the combined lengths of a memory die 108 from each stack (A+A=2A) plus the total offset distance from each stack (E+E=2E) plus the gap X between the stacks. As such, L=2A+2E+X. As such, X=L−2A−2E. For devices that have four memory dies in each substack (as in FIG. 2), E=3*B. In such scenarios, X=L−2A−6B. In general, for devices that have N memory dies in each substack, X=L−2A−(N−2)*B.

There are two gaps having distance X: one gap in area 202 between memory dies 108h and 108t, and another gap in area 204 between memory dies 108d and 108p. Areas 202 and 204 are the most restrictive in terms of molding compound flow during encapsulation, slowing down the flow of molding compound and potentially causing uneven mold flow and/or voids in the package.

The gap between die stacks A and B may be increased in the x direction by offsetting one die stack with respect to the other in the z direction, thus providing for increased inter-stack gaps in the x direction while maintaining x-y dimensions of the package. The offset in the z direction may be implemented by adjusting the thickness of one of the spacers in the z direction (as described below with reference to FIG. 3), and/or by adjusting the thickness of one or more of the memory dies in one of the lower substacks with respect to the other (as described below with reference to FIG. 4).

Figure 3:
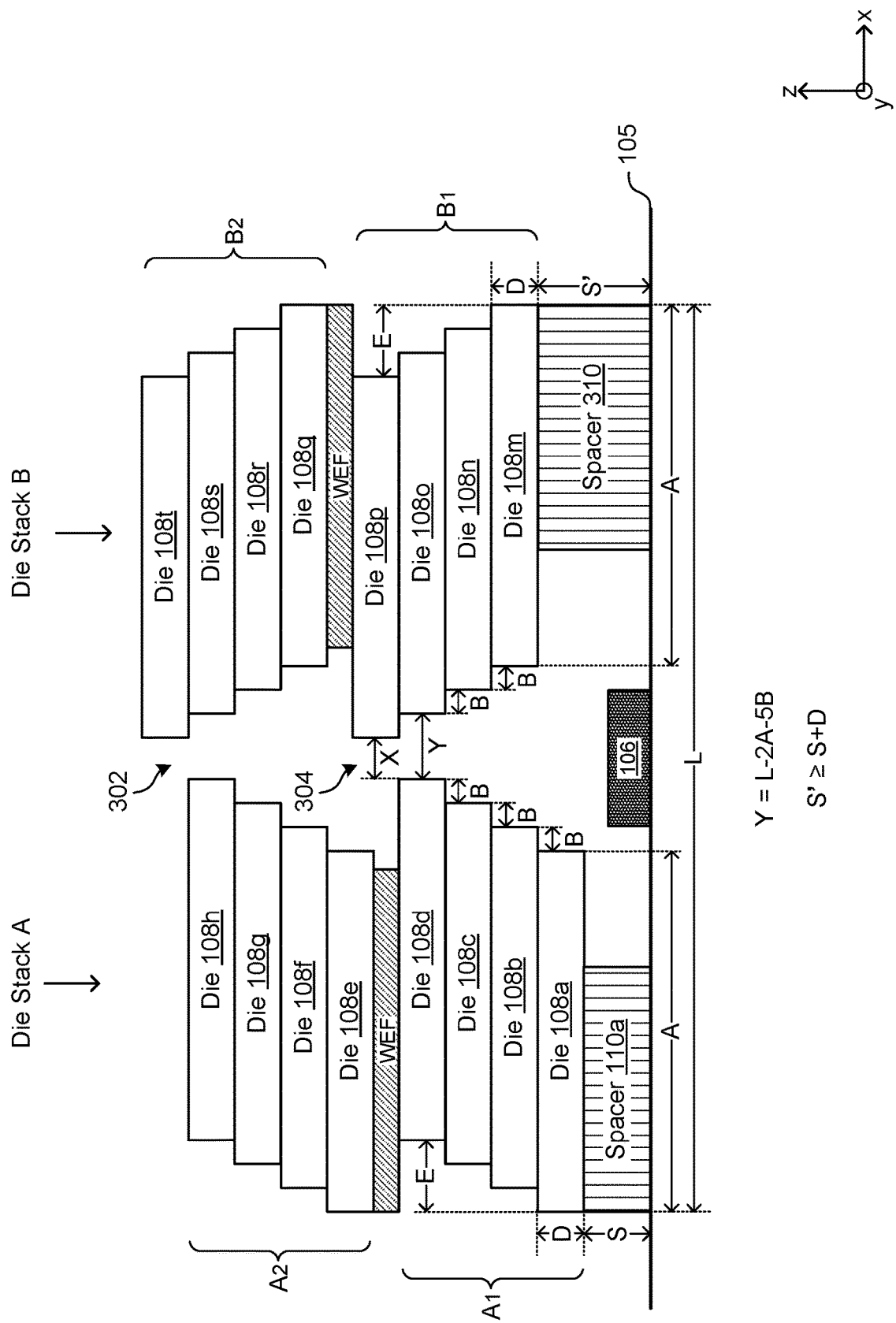
FIG. 3 is a detailed view of two stacks of memory dies that are offset with respect to each other due to a difference in spacer thickness in accordance with some implementations.

FIG. 3 is a detailed view of two stacks of memory dies that are offset with respect to each other due to a difference in spacer thickness in accordance with some implementations. Elements in FIG. 3 that correspond to elements in FIG. 2 share the same reference numbers, and some elements may not be further discussed so as not to obscure certain aspects of the disclosure.

By adjusting the thickness of one of the spacers with respect to the other, one die stack may be offset in the z direction with respect to the other die stack. In FIG. 3, spacer 310 in die stack B is thicker than spacer 110a in die stack A, thereby causing the memory dies 108 in die stack B to be offset in the z direction with respect to corresponding memory dies in die stack A. Specifically, top memory die 108p in die stack B is located farther away from substrate surface 105 (in the z direction) than top memory die 108d in die stack A.

As such, the distance Y in the x direction between (i) top memory die 108d in die stack A and (ii) the memory die that occupies the same plane (in the x direction) as memory die 108d in die stack B (memory die 108o) is greater than the distance X in the x direction between the top memory dies 108d and 108p in each die stack. The greater distance Y provides more space through which molding compound may flow during encapsulation (compared to distance X in FIG. 2). The greater distance Y is also present between memory dies 108h and 108s in the upper substacks of each die stack.

Thus, gaps 302 and 304 between the closest memory dies in each substack, having increased space, provide less resistance to the flow of molding compound during encapsulation, thereby decreasing voids in the package (compared to gaps 202 and 204 in FIG. 2).

Distance Y is greater than footprint length L−total die length 2A−total offset distance 2E. As such, Y>L−2A−2E. For scenarios in which each substack has four memory dies (such as in FIG. 3), E=3*B. Thus, Y>L−2A−6B. In such scenarios, Y may equal L−2A−5B. In general, if each substack has N memory dies, Y>L−2A−(N−2)*B. For example, Y may equal L−2A−(N−3)*B.

In some implementations, the offset between the two die stacks in the z direction is large enough to ensure that the top memory die in one substack is at least higher (farther away from substrate surface 105 in the z direction) than the top memory die in a neighboring substack. For example, as in FIG. 3, memory die 108p is higher than memory die 108d. This ensures the horizontal gap (in the x direction) between the top memory die in one stack (e.g., 108d) and the memory die that is substantially coplanar with that memory die (e.g., 108p) is at least distance Y. To ensure that this is the case, in some implementations, the thickness S' of the thicker spacer (spacer 310) is greater than or equal to the thickness S of the thinner spacer (spacer 110a) plus the thickness D of one of the memory dies 108. Thus, S'>S+D.

Figure 4:
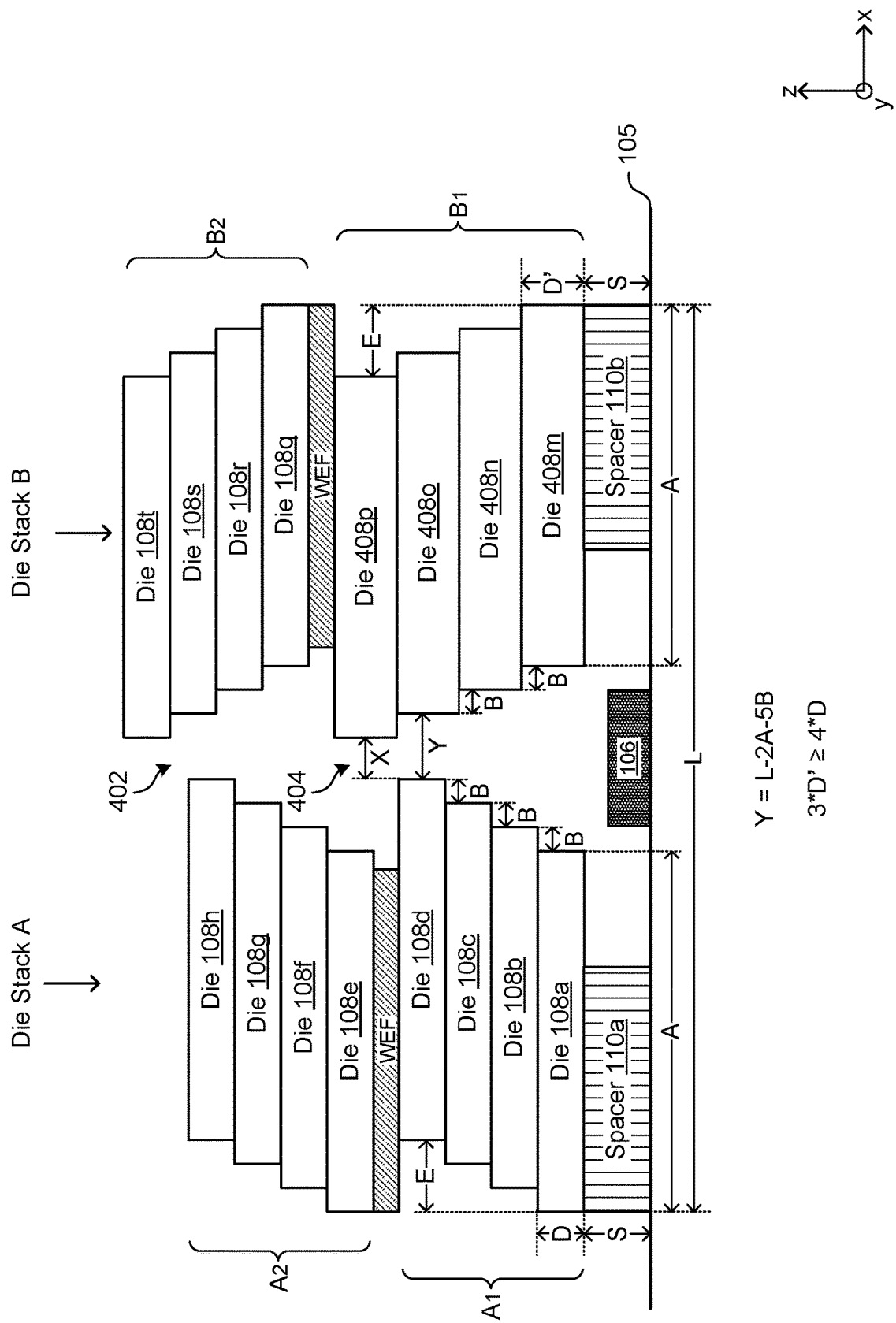
FIG. 4 is a detailed view of two stacks of memory dies that are offset with respect to each other due to a difference in memory die thickness in accordance with some implementations.

FIG. 4 is a detailed view of two stacks of memory dies that are offset with respect to each other due to a difference in memory die thickness in accordance with some implementations. Elements in FIG. 4 that correspond to elements in FIGS. 2 and 3 share the same reference numbers, and some elements may not be further discussed so as not to obscure certain aspects of the disclosure.

By increasing the thickness of at least one of the memory dies in a lower substack (e.g., B1) with respect to the thickness of the memory dies in the other lower substack (e.g., A1), one die stack may be offset in the z direction with respect to the other die stack. In FIG. 4, memory dies 408m-408p in lower substack B1 in die stack B are thicker than memory dies 108a-108d in lower substack A1 in die stack A, thereby causing the memory dies in die stack B to be offset in the z direction with respect to corresponding memory dies in die stack A. Specifically, top memory die 408p in die stack B is located farther away from substrate surface 105 (in the z direction) than top memory die 108d in die stack A.

As such, the distance Y in the x direction between (i) top memory die 108d in die stack A and (ii) the memory die that occupies the same plane (in the x direction) as memory die 108d in die stack B (memory die 408o) is greater than the distance X in the x direction between the top memory dies 108d and 408p in each die stack. The greater distance Y provides more space through which molding compound may flow during encapsulation (compared to distance X in FIG. 2). The greater distance Y is also present between memory dies 108h and 108s in the upper substacks of each die stack.

Thus, gaps 402 and 404 between the closest memory dies in each substack, having increased space, provide less resistance to the flow of molding compound during encapsulation, thereby decreasing voids in the package (compared to gaps 202 and 204 in FIG. 2).

Distance Y is greater than footprint length L−total die length 2A−total offset distance 2E. As such, Y>L−2A−2E. For scenarios in which each substack has four memory dies (such as in FIG. 4), E=3*B. Thus, Y>L−2A−6B. In such scenarios, Y may equal L−2A−5B. In general, if each substack has N memory dies, Y>L−2A−(N−2)*B. For example, Y may equal L−2A−(N−3)*B.

In some implementations, the offset between the two die stacks in the z direction is large enough to ensure that the top memory die in one substack is at least higher (farther away from substrate surface 105 in the z direction) than the top memory die in a neighboring substack. For example, as in FIG. 4, memory die 408p is higher than memory die 108d. This ensures the horizontal gap (in the x direction) between the top memory die in one stack (e.g., 108d) and the memory die that is substantially coplanar with that memory die (e.g.,

408p) is at least distance Y. To ensure that this is the case, for implementations in which each substack has N memory dies, the thickness D' of the bottom (N−1) memory dies in one die stack (e.g., 408m-408o) is greater than or equal to the thickness D of all N memory dies (e.g., 108a-108d) in the other die stack. Thus, (N−1)*D'>N*D. For example, if each substack has 4 memory dies, then 3*D'>4*D.

In some implementations, each memory die in the lower substack of the higher die stack (here, substack B1) has the same increased thickness D'. Alternatively, at least one memory die in the lower substack of the higher die stack has an increased thickness, while the rest of the memory dies in the lower substack of the higher die stack has the same thickness D as the memory dies in the other substacks. Regardless of the implementation, the memory dies in the upper substack of the higher die stack (here, substack B2) may have the same thickness D as the memory dies in the other substack, since the increased offset in the z direction may be implemented in the lower substack (B1) only. By keeping the memory dies in the upper substack (B2) the same thickness as the memory dies in the lower substack (108a-108h), the z dimension of the package may be maintained (or increases in the z dimension may be minimized).

As discussed above, one die stack may be offset in the z direction with respect to the other die stack by adjusting spacer thickness (e.g., making one spacer thicker as described with reference to FIG. 3) or by adjusting memory die thickness (e.g., making one or more memory dies thicker as described with reference to FIG. 4). In some implementations, a combination of these techniques may be applied. Specifically, a thicker spacer (e.g., 310, FIG. 3) and at least one thicker memory die (e.g., 408m, FIG. 4) may be placed in one die stack (e.g., die stack B) to introduce an offset in the z direction with respect to the other die stack (e.g., die stack A).

In some implementations, the minimum gap in the x direction between the two die stacks must be greater than or equal to 300 um in order to provide sufficient space through which molding compound may flow. In some scenarios, distance X is less than 300 um. As such, providing an offset in the z direction to one of the die stacks provides an increased gap, distance Y, that satisfies the requirement for an opening that is greater than or equal to 300 um. The exact gap specification depends on the characteristics of the molding compound and the architecture of the package; therefore, the value of 300 um is only an example to illustrate the concepts described herein. Other example values include spacer thickness S=102 um, increased spacer thickness S'=183 um, memory die thickness D=61 um, and increased memory die thickness D'=81 um. As noted above, these values are nonlimiting examples provided for illustrative purposes.

In some implementations, in order to satisfy top package clearance specifications (the amount of space between the top of the die stacks and the top of the package, a thicker spacer (e.g., 310, FIG. 3) may be provide in combination with one or more thinner memory dies (e.g., having a thickness less than D, e.g., 58 um) in the same stack as the thicker spacer. In other implementations, in order to satisfy top package clearance specifications, thicker memory dies (e.g., 408m-408p) may be provided in combination with thinner memory dies (e.g., having a thickness less than D, e.g., 51 um) in the same stack (e.g., in the upper substack B2).

Figure 5:
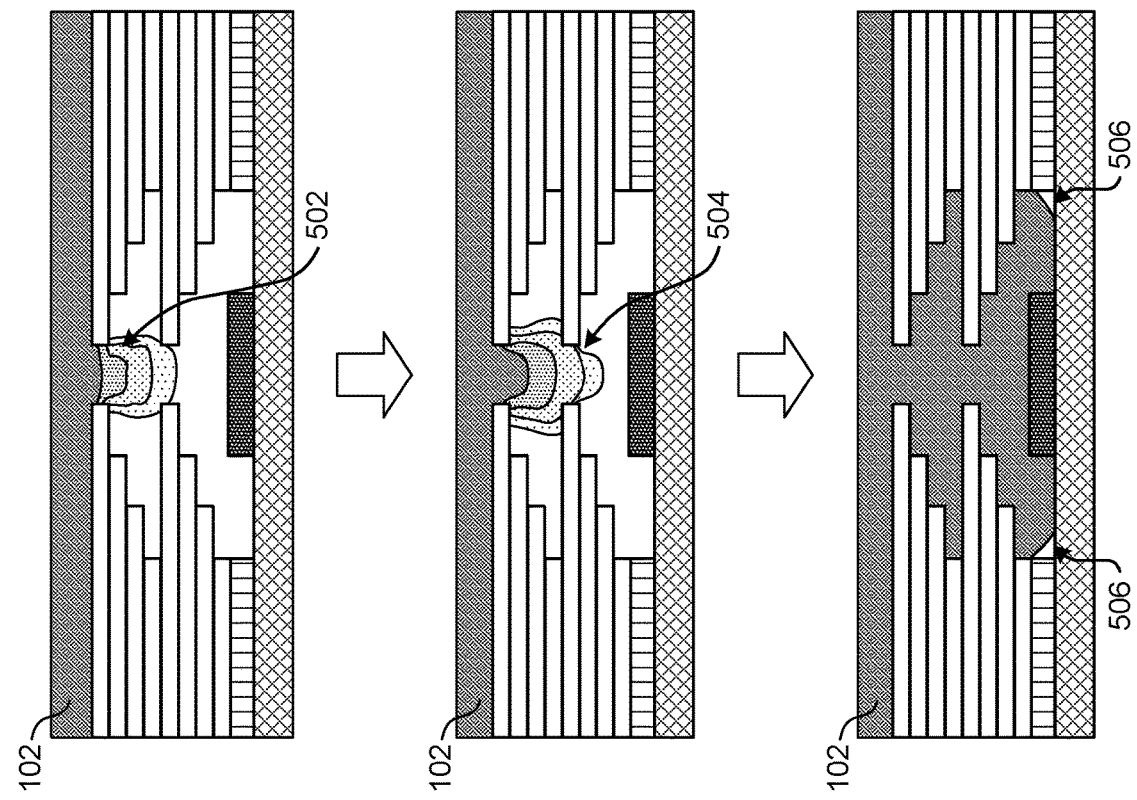
FIG. 5 is a cross-sectional view of a semiconductor memory package as shown in FIG. 1 during an encapsulation process.

FIG. 5 is a cross-sectional view of a semiconductor memory package as shown in FIG. 1 during an encapsulation process. During the encapsulation process, molding compound 102 flows through a first gap 502 between upper substacks of adjacent die stacks, and subsequently through a second gap 504 between lower substacks of adjacent die stacks. If gaps 502 and 504 do not satisfy minimum gap distance requirements, molding compound 102 may not adequately fill the package, leaving one or more voids 504 with missing or thin molding compound.

Figure 6:
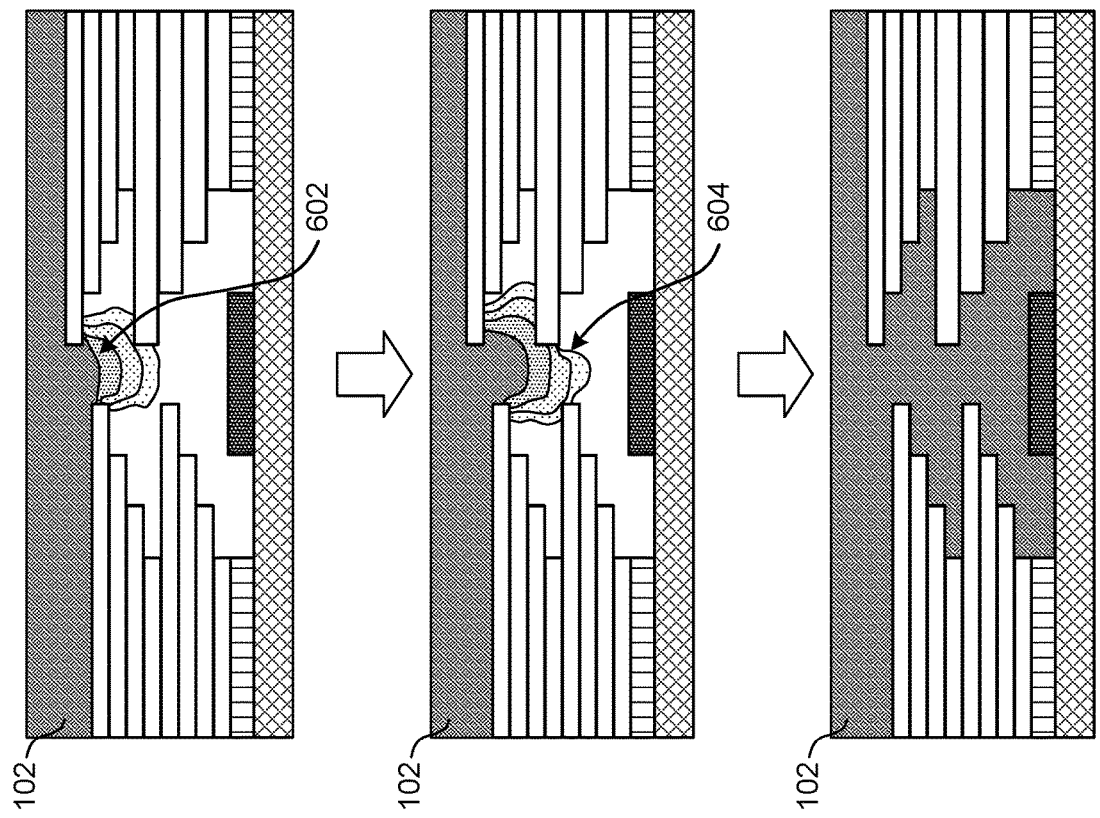
FIG. 6 is a cross-section view of a semiconductor memory package as shown in FIG. 4 during an encapsulation process in accordance with some implementations.

FIG. 6 is a cross-section view of a semiconductor memory package as shown in FIG. 4 during an encapsulation process in accordance with some implementations. During the encapsulation process, molding compound 102 flows through a first gap 602 between upper substacks of adjacent die stacks, and subsequently through a second gap 604 between lower substacks of adjacent die stacks. Since gaps 602 and 604 satisfy minimum gap distance requirements (due to the adjacent die stacks being offset with respect to each other in the z direction), molding compound 102 adequately fills the package, leaving no voids.

The following discussion includes several example implementations referring to FIGS. 3 and 4 above. A semiconductor memory package includes a substrate including a top surface 105 extending in a first direction (+x) and a second direction (−x) opposite the first direction.

The package further includes a first stack of memory dies (stack A) electrically coupled to the top surface of the substrate and including: a first substack (A1) of staggered memory dies offset with respect to each other in the first direction and including a bottom memory die (108a) and a top memory die (108d); and a second substack (A2) of staggered memory dies offset with respect to each other in the first direction and positioned above the first substack of staggered memory dies.

The package further includes a second stack of memory dies (stack B) electrically coupled to the top surface of the substrate, the second stack of memory dies positioned adjacent to the first stack of memory dies in the first direction and including: a third substack (B1) of staggered memory dies offset with respect to each other in the second direction and including a bottom memory die (108m or 408m) and a top memory die (108p or 408p); and a fourth substack (B2) of staggered memory dies offset with respect to each other in the second direction and positioned above the third substack of staggered memory dies.

In some implementations, the top memory die of the first substack (108d) and a memory die positioned below the top memory die of the third substack (108o or 408o; or alternatively 108n, 108m, 408n, or 408m) are at least partially coplanar; and a distance (Y) in the first direction between the top memory die of the first substack (108d) and the memory die positioned below the top memory die of the third substack (108o or 408o) is greater than a distance (X) in the first direction between the top memory die of the first substack (108d) and the top memory die of the third substack (108p or 408p).

In some implementations, the distance (Y) in the first direction between the top memory die of the first substack (108d) and the memory die positioned below the top memory die of the third substack (108p or 408p) is greater than or equal to a sum of (i) the distance (X) in the first direction between the top memory die of the first substack (108d) and the top memory die of the third substack (108p or 408p) and (ii) an offset (B) in the first direction between the top memory die of the third substack (108p or 408p) and the memory die positioned below the top memory die of the third substack (108o or 408o).

In some implementations, the first stack of memory dies (stack A) and the second stack of memory dies (stack B)

occupy a footprint on the top surface of the substrate having a length L in the first direction; the bottom memory die of the first substack (108a) has a length A in the first direction (or alternatively, any of the dies in the first substack) and is offset from the top memory die of the first substack (108d) by a distance E in the first direction; the bottom memory die of the third substack (108m or 408m) has a length A in the second direction (or alternatively, any of the dies in the first substack) and is offset from the top memory die of the third substack (108p or 408p) by a distance E in the second direction; and a distance (Y) in the first direction between the top memory die of the first substack (108d) and a memory die in the third substack (108o or 408o) that is at least partially coplanar with the top memory die of the first substack is greater than L−2A−2E.

In some implementations, the package further includes a first spacer (110a) having a first thickness (S) and positioned between the top surface of the substrate (105) and the bottom memory die of the first substack (108a); and a second spacer (310) having a second thickness (S') and positioned between the top surface of the substrate (105) and the bottom memory die of the third substack (108m or 408m); wherein the second thickness (S') is greater than the first thickness (S). In some implementations, the second thickness (S') is greater than or equal to a sum of the first thickness (S) and a thickness of the bottom die of the first substack (D).

In some implementations, the bottom memory die of the third substack (408m) is thicker than the bottom memory die of the first substack (108a). In some implementations, each memory die of the third substack is thicker than (having thickness D') any of the memory dies of the first substack (having thickness D). In some implementations, each memory die of the third substack (having thickness D') is thicker than any of the memory dies of the fourth substack (having thickness D). In some implementations, a partial subset of memory dies including each memory die of the third substack except for the top memory die of the third substack (408m, 408n, and 408o) has a thickness (3*D') that is greater than or equal to a thickness (4*D) of the first substack of staggered memory dies (108a, 108b, 108c, and 108d).

In some implementations, the package further includes: a first wire-embedded film (WEF) positioned between the first substack of staggered memory dies and the second substack of staggered memory dies (between 108d and 108e); and a second wire-embedded film (WEF) positioned between the third substack of staggered memory dies and the fourth substack of staggered memory dies (between 108p and 108q, or between 408p and 108q); wherein the first wire-embedded film is at least partially coplanar with a memory die in the third substack (108p or 408p) positioned below the second wire-embedded film.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. The words "inwardly" and "outwardly" refer to directions toward and away from, respectively, the geometric center of the ball grid array having a multi-surface trace interface. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor memory package comprising:
    a substrate including a top surface extending in a first direction and a second direction opposite the first direction;
    a first stack of memory dies electrically coupled to the top surface of the substrate and including:
        a first substack of staggered memory dies offset with respect to each other in the first direction and including a bottom memory die and a top memory die; and
        a second substack of staggered memory dies offset with respect to each other in the first direction and positioned above the first substack of staggered memory dies; and
    a second stack of memory dies electrically coupled to the top surface of the substrate, the second stack of memory dies positioned adjacent to the first stack of memory dies and including:
        a third substack of staggered memory dies offset with respect to each other in the second direction and including a bottom memory die and a top memory die; and
        a fourth substack of staggered memory dies offset with respect to each other in the second direction and positioned above the third substack of staggered memory dies;
    wherein:
        the top memory die of the first substack and a memory die positioned below the top memory die of the third substack are at least partially coplanar; and
        a distance in the first direction between the top memory die of the first substack and the memory die positioned below the top memory die of the third substack is greater than a distance in the first direction between the top memory die of the first substack and the top memory die of the third substack.

2. The semiconductor memory package of claim 1, wherein the distance in the first direction between the top memory die of the first substack and the memory die positioned below the top memory die of the third substack is greater than or equal to a sum of (i) the distance in the first direction between the top memory die of the first substack and the top memory die of the third substack and (ii) an offset in the first direction between the top memory die of the third substack and the memory die positioned below the top memory die of the third substack.

3. The semiconductor memory package of claim 1, wherein:
the first stack of memory dies and the second stack of memory dies occupy a footprint on the top surface of the substrate having a length L in the first direction;
the bottom memory die of the first substack has a length A in the first direction and is offset from the top memory die of the first substack by a distance E in the first direction;
the bottom memory die of the third substack has a length A in the second direction and is offset from the top memory die of the third substack by a distance E in the second direction; and
a distance in the first direction between the top memory die of the first substack and a memory die in the third substack that is at least partially coplanar with the top memory die of the first substack is greater than L−2A−2E.

4. The semiconductor memory package of claim 1, further comprising:
a first spacer having a first thickness and positioned between the top surface of the substrate and the bottom memory die of the first substack; and
a second spacer having a second thickness and positioned between the top surface of the substrate and the bottom memory die of the third substack;
wherein the second thickness is greater than the first thickness.

5. The semiconductor memory package of claim 4, wherein the second thickness is greater than or equal to a sum of the first thickness and a thickness of the bottom die of the first substack.

6. The semiconductor memory package of claim 1, wherein the bottom memory die of the third substack is thicker than the bottom memory die of the first substack.

7. The semiconductor memory package of claim 6, wherein each memory die of the third substack is thicker than any of the memory dies of the first substack.

8. The semiconductor memory package of claim 6, wherein each memory die of the third substack is thicker than any of the memory dies of the fourth substack.

9. The semiconductor memory package of claim 6, wherein a partial subset of memory dies including each memory die of the third substack except for the top memory die of the third substack has a thickness that is greater than or equal to a thickness of the first substack of staggered memory dies.

10. The semiconductor memory package of claim 1, further comprising:
a first wire-embedded film positioned between the first substack of staggered memory dies and the second substack of staggered memory dies; and
a second wire-embedded film positioned between the third substack of staggered memory dies and the fourth substack of staggered memory dies;
wherein the first wire-embedded film is at least partially coplanar with a memory die in the third substack positioned below the second wire-embedded film.

11. A semiconductor memory package comprising:
a substrate including a top surface extending in a first direction and a second direction opposite the first direction;
a first stack of memory dies electrically coupled to the top surface of the substrate and including:
a first substack of staggered memory dies offset with respect to each other in the first direction and including a bottom memory die and a top memory die; and
a second substack of staggered memory dies offset with respect to each other in the first direction and positioned above the first substack of staggered memory dies; and
a second stack of memory dies electrically coupled to the top surface of the substrate, the second stack of memory dies positioned adjacent to the first stack of memory dies and including:
a third substack of staggered memory dies offset with respect to each other in the second direction and including a bottom memory die and a top memory die; and
a fourth substack of staggered memory dies offset with respect to each other in the second direction and positioned above the third substack of staggered memory dies;
wherein a distance in the first direction between the top memory die of the first substack and a memory die positioned below the top memory die of the third substack is greater than or equal to a sum of (i) a distance in the first direction between the top memory die of the first substack and the top memory die of the third substack and (ii) an offset in the first direction between the top memory die of the third substack and the memory die positioned below the top memory die of the third substack.

12. The semiconductor memory package of claim 11, wherein the top memory die of the first substack and the memory die positioned below the top memory die of the third substack are at least partially coplanar.

13. The semiconductor memory package of claim 11, further comprising:
a first spacer having a first thickness and positioned between the top surface of the substrate and the bottom memory die of the first substack; and
a second spacer having a second thickness and positioned between the top surface of the substrate and the bottom memory die of the third substack;
wherein the second thickness is greater than or equal to a sum of the first thickness and a thickness of the bottom die of the first substack.

14. The semiconductor memory package of claim 11, wherein:
the bottom memory die of the third substack is thicker than the bottom memory die of the first substack; and
a partial subset of memory dies including each memory die of the third substack except for the top memory die of the third substack has a thickness that is greater than or equal to a thickness of the first substack of staggered memory dies.

15. The semiconductor memory package of claim 11, further comprising:
a first wire-embedded film positioned between the first substack of staggered memory dies and the second substack of staggered memory dies; and
a second wire-embedded film positioned between the third substack of staggered memory dies and the fourth substack of staggered memory dies;
wherein the first wire-embedded film is at least partially coplanar with a memory die in the third substack positioned below the second wire-embedded film.

16. A semiconductor memory package comprising:

a substrate including a top surface extending in a first direction and a second direction opposite the first direction;

a first stack of memory dies electrically coupled to the top surface of the substrate and including:
- a first substack of staggered memory dies offset with respect to each other in the first direction and including a bottom memory die and a top memory die; and
- a second substack of staggered memory dies offset with respect to each other in the first direction and positioned above the first substack of staggered memory dies; and a second stack of memory dies electrically coupled to the top surface of the substrate, the second stack of memory dies positioned adjacent to the first stack of memory dies and including:
- a third substack of staggered memory dies offset with respect to each other in the second direction and including a bottom memory die and a top memory die; and
- a fourth substack of staggered memory dies offset with respect to each other in the second direction and positioned above the third substack of staggered memory dies;

wherein:
- the first stack of memory dies and the second stack of memory dies occupy a footprint on the top surface of the substrate having a length L in the first direction;
- the bottom memory die of the first substack has a length A in the first direction and is offset from the top memory die of the first substack by a distance E in the first direction;
- the bottom memory die of the third substack has a length A in the second direction and is offset from the top memory die of the third substack by a distance E in the second direction; and
- a distance in the first direction between the top memory die of the first substack and a memory die in the third substack that is at least partially coplanar with the top memory die of the first substack is greater than L−2A−2E.

17. The semiconductor memory package of claim 16, wherein the top memory die of the first substack and the memory die positioned below the top memory die of the third substack are at least partially coplanar.

18. The semiconductor memory package of claim 16, further comprising:
- a first spacer having a first thickness and positioned between the top surface of the substrate and the bottom memory die of the first substack; and
- a second spacer having a second thickness and positioned between the top surface of the substrate and the bottom memory die of the third substack;
- wherein the second thickness is greater than or equal to a sum of the first thickness and a thickness of the bottom die of the first substack.

19. The semiconductor memory package of claim 16, wherein:
- the bottom memory die of the third substack is thicker than the bottom memory die of the first substack; and
- a partial subset of memory dies including each memory die of the third substack except for the top memory die of the third substack has a thickness that is greater than or equal to a thickness of the first substack of staggered memory dies.

20. The semiconductor memory package of claim 16, further comprising:
- a first wire-embedded film positioned between the first substack of staggered memory dies and the second substack of staggered memory dies; and
- a second wire-embedded film positioned between the third substack of staggered memory dies and the fourth substack of staggered memory dies;
- wherein the first wire-embedded film is at least partially coplanar with a memory die in the third substack positioned below the second wire-embedded film.

* * * * *